(12) United States Patent
Ahmed et al.

(10) Patent No.: US 7,436,339 B2
(45) Date of Patent: Oct. 14, 2008

(54) METHOD AND APPARATUS TO EMULATE A FILTER USING DIGITAL ELEMENTS

(75) Inventors: Walid Khairy Mohamed Ahmed, Tinton Falls, NJ (US); Anthony Dennis, Belle Meade, NJ (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 11/185,514

(22) Filed: Jul. 20, 2005

(65) Prior Publication Data

US 2007/0018873 A1  Jan. 25, 2007

(51) Int. Cl.
*H03M 1/66* (2006.01)
(52) U.S. Cl. .................................................. 341/144
(58) Field of Classification Search ................ 375/264, 375/278, 285; 332/104, 107; 341/143, 144, 341/147
See application file for complete search history.

(56) References Cited

U.S. PATENT DOCUMENTS

| | | | |
|---|---|---|---|
| 5,012,245 A * | 4/1991 | Scott et al. ................... 341/150 |
| 5,369,606 A | 11/1994 | Hessel |
| 5,371,242 A | 12/1994 | Weyer et al. |
| 5,524,286 A | 6/1996 | Chiesa et al. ................ 455/126 |
| 5,598,436 A | 1/1997 | Brajal et al. ................. 375/297 |
| 5,905,760 A | 5/1999 | Schnabl et al. .............. 375/296 |
| 6,043,707 A | 3/2000 | Budnik ........................ 330/10 |
| 6,125,266 A | 9/2000 | Matero et al. ............... 455/126 |
| 6,147,553 A | 11/2000 | Kolanek ..................... 330/10 |
| 6,320,912 B1 * | 11/2001 | Baba .......................... 375/264 |
| 6,449,465 B1 | 9/2002 | Gailus et al. ............... 455/126 |
| 6,512,417 B2 * | 1/2003 | Booth et al. ................ 330/149 |
| 6,515,605 B2 * | 2/2003 | Panasik et al. ............. 341/143 |
| 6,621,340 B1 | 9/2003 | Perthold et al. ............ 330/149 |
| 6,646,581 B1 * | 11/2003 | Huang ........................ 341/43 |
| 6,834,084 B2 | 12/2004 | Hietala ....................... 375/296 |
| 2002/0098812 A1 | 7/2002 | Sourour et al. ............. 455/91 |
| 2002/0186783 A1 | 12/2002 | Opas et al. .................. 375/297 |
| 2002/0193085 A1 | 12/2002 | Mathe et al. ................ 455/126 |
| 2003/0095608 A1 | 5/2003 | Duperray .................... 375/297 |
| 2003/0215025 A1 | 11/2003 | Hietala ....................... 375/297 |
| 2003/0215026 A1 | 11/2003 | Hietala ....................... 375/297 |
| 2003/0235253 A1 | 12/2003 | Dally |
| 2004/0021517 A1 | 2/2004 | Irvine et al. ................ 330/151 |

(Continued)

FOREIGN PATENT DOCUMENTS

EP  1 257 062 A2  11/2002

(Continued)

OTHER PUBLICATIONS

Kim Myung-Soon et al: "Look-up table based pulse-shaping filter design" Electronics Letters, IEE Stevenage, GB, vol. 36, No. 17, Aug. 17, 2000 (Aug. 17, 2000), pp. 1505-1506, XP006015586 ISSN: 0013-5194.

*Primary Examiner*—Brian Young

(57) ABSTRACT

A system, apparatus, method and article to emulate a filter using digital elements are described. The apparatus may include a digital-to-analog converter having an impulse response emulator, the impulse response emulator to receive multiple digital signals each having a predetermined waveform, and convert a sequence of bits from each digital signal to a predetermined analog waveform corresponding to the sequence of bits using a lookup table or digital filter. Other embodiments are described and claimed.

20 Claims, 9 Drawing Sheets

U.S. PATENT DOCUMENTS

| | | | |
|---|---|---|---|
| 2004/0047432 A1 | 3/2004 | Iwasaki | 375/297 |
| 2004/0179629 A1* | 9/2004 | Song et al. | 375/296 |
| 2005/0017801 A1 | 1/2005 | Bachman, II et al. | 330/149 |
| 2005/0122164 A1 | 6/2005 | Brandt et al. | 330/10 |

FOREIGN PATENT DOCUMENTS

| | | |
|---|---|---|
| GB | 2 219 158 A | 11/1989 |
| SU | 1679478 A1 | 9/1991 |

* cited by examiner

Filter Input

Filter Output

METHOD AND APPARATUS TO EMULATE A FILTER USING DIGITAL ELEMENTS

CROSS-REFERENCE TO RELATED APPLICATION

This application relates to U.S. patent application Ser. No. 11/185,953 titled "Method And Apparatus To Emulate A Filter" filed Jul. 20, 2005 and having inventors Walid Khairy Mohamed Ahmed and Anthony Dennis, the entirety of which is incorporated herein for all purposes.

BACKGROUND

Electronic devices may need to convert information between an analog domain and a digital domain. For example, a wireless device may use an analog-to-digital converter (ADC) to convert analog voice information to digital signals for communication over a digital wireless system. Similarly, a wireless device may use a digital-to-analog converter (DAC) to convert digital signals to analog signals prior to reproducing the information for a listener.

DAC devices may sometimes use a filter to remove noise from a signal. The noise may originate from a number of sources, such as imperfections in the transmission system, manufacturing defects, signal processing errors, and so forth. Some filters, however, may be expensive to implement in terms of power, size and cost. Consequently, improvements in filtering techniques may improve the performance of a circuit, device or system.

SUMMARY

One exemplary embodiment may include an apparatus comprising a digital-to-analog converter having an impulse response emulator. The impulse response emulator may receive multiple digital signals each having a predetermined waveform. The impulse response emulator may convert a sequence of bits from each digital signal to a predetermined analog waveform corresponding to the sequence of bits using a lookup table. Other embodiments are described and claimed.

DETAILED DESCRIPTION

Figure 1:
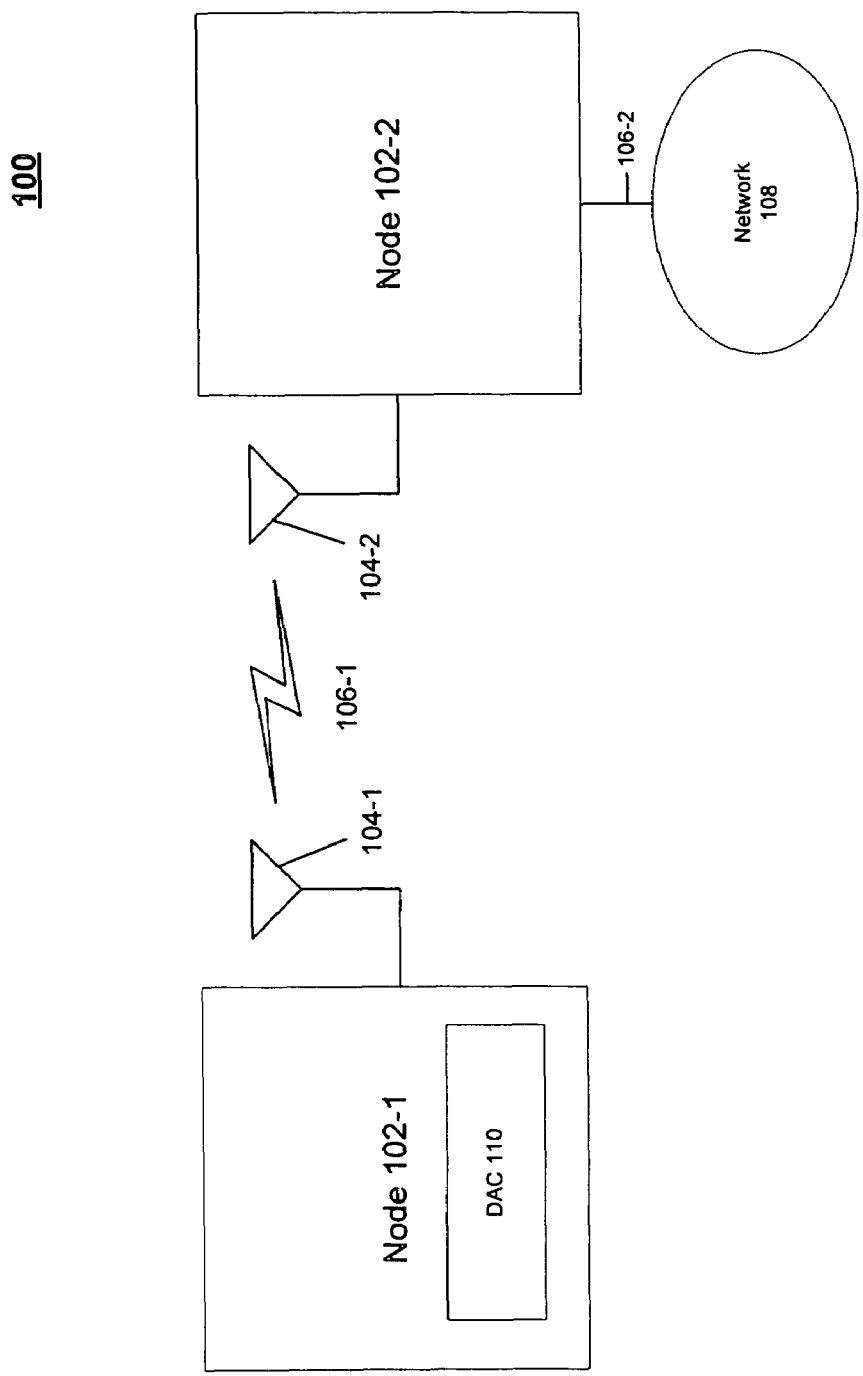
FIG. 1 illustrates an exemplary block diagram of a communication system in accordance with one embodiment.

FIG. 1 illustrates an exemplary block diagram of a communication system in accordance with one embodiment. FIG. 1 illustrates a block diagram of a communication system 100. Communication system 100 may comprise one or more nodes. A node may comprise any physical or logical entity having a unique address in system 100. Examples of a node may include, but are not necessarily limited to, a computer, server, workstation, notebook computer, handheld computer, telephone, cellular telephone, personal digital assistant (PDA), combination cellular telephone and PDA, and so forth. The unique address may comprise, for example, a network address such as an Internet Protocol (IP) address, a device address such as a Media Access Control (MAC) address, a telephone number, a personal identification number (PIN), and so forth.

The nodes of system 100 may be arranged to communicate different types of information, such as media information and control information. Media information is used herein in a very general sense and may refer to any data representing content meant for a user, such as voice information, video information, audio information, text information, numerical information, alphanumeric symbols, graphics, images, symbols, and so forth. Control information is also used herein in a very general sense and may refer to any data representing commands, instructions or control words meant for an automated system. For example, control information may be used to route media information through a system, or instruct a node to process the media information in a certain manner.

The nodes of system 100 may communicate media and control information in accordance with one or more protocols. A protocol may comprise a set of predefined rules or instructions to control how the nodes communicate information between each other. The protocol may be defined by one or more protocol standards as promulgated by a standards organization, such as the Internet Engineering Task Force (IETF), International Telecommunications Union (ITU), the Institute of Electrical and Electronics Engineers (IEEE), and so forth.

System 100 may be implemented as a wired communication system, a wireless communication system, or a combination of both. Although system 100 may be illustrated using a particular communications media by way of example, it may be appreciated that the principles and techniques discussed herein may be implemented using any type of communication media and accompanying technology.

In one embodiment, system 100 may be implemented as a wireless system. For example, system 100 may include one or more wireless nodes arranged to communicate information over one or more types of wireless communication media, sometimes referred to herein as wireless shared media. An example of a wireless communication media may include portions of a wireless spectrum, such as the RF spectrum. The wireless nodes may include components and interfaces suitable for communicating information signals over the designated wireless spectrum, such as one or more antennas, wireless transmitters/receivers ("transceivers") or radios, amplifiers, filters, control logic, and so forth.

Referring again to FIG. 1, system 100 may include one or more nodes 102-1-p. Although FIG. 1 is shown with a limited number of nodes in a certain topology, it may be appreciated that system 100 may include more or less nodes in any type of topology as desired for a given implementation.

In one embodiment, system 100 may include a node 102-1. Node 102-1 may comprise, for example, a fixed or mobile device having wireless capabilities. Examples for node 102-1 may include a computer, server, workstation, notebook computer, handheld computer, telephone, cellular telephone, personal digital assistant (PDA), combination cellular telephone and PDA, and so forth. In one embodiment, for example, node 102-1 may comprise a mobile device such as a cellular telephone. For example, node 102-1 may comprise a cellular telephone operating in accordance with a polar architecture, such as described in U.S. Patent Application 2004/0109572 A1 titled "Apparatus, Methods and Articles of Manufacture For Noise Reduction In Electromagnetic Signal Processing," filed on Dec. 2, 2002 and published on Jun. 10, 2004, the entirety of which is hereby incorporated by reference for all purposes. Although some embodiments may be described with mobile device 102-1 implemented as a cellular telephone by way of example, and a polar architecture in particular, it may be appreciated that other embodiments may be implemented using other wireless devices and other architectures as well. The embodiments are not limited in this context.

In one embodiment, system 100 may include a node 102-2. Node 102-2 may comprise, for example, a fixed station having wireless capabilities. Examples for node 102-2 may include a wireless access point (AP), base station or node B, router, switch, hub, gateway, and so forth. In one embodiment, for example, node 102-2 may comprise a base station or node B for a cellular telephone. Although some embodiments may be described with node 102-2 implemented as a base station or node B by way of example, it may be appreciated that other embodiments may be implemented using other wireless devices as well.

In one embodiment, mobile device 102-1 and fixed station 102-2 may comprise part of a cellular communication system. Examples of cellular communication systems may include Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) cellular radiotelephone systems, Extended-TDMA (E-TDMA) cellular radiotelephone systems, third generation (3G) systems such as Wide-band CDMA (WCDMA), CDMA-2000, Universal Mobile Telephone System (UMTS) cellular radiotelephone systems compliant with the Third-Generation Partnership Project (3GPP), and so forth. Communications between mobile device 102-1 and fixed station 102-2 may be performed over wireless communication medium 106-1 in accordance with a number of wireless protocols suitable for a given type of cellular system.

In addition to voice communication services, mobile device 102-1 and fixed station 102-2 may communicate using a number of different data communication services. Examples of cellular data communication systems offering data communication services may include GSM/GPSR systems, CDMA/1xRTT systems, Enhanced Data GSM Environment (EDGE) systems, and so forth.

In one embodiment, system 100 may include a network 108 connected to node 102-2 by a wired communications medium 106-2. Examples for wired communications medium 106-2 may include a wire, cable, printed circuit board (PCB), backplane, switch fabric, semiconductor material, twisted-pair wire, co-axial cable, fiber optics, and so forth. Network 108 may comprise part of the same cellular system as mobile device 102-1 and fixed station 102-2, and may further include additional cellular system nodes such as mobile stations, base stations, radio network controllers (RNC), mobile services switching centers (MSC), and so forth. In addition, network 108 may comprise additional nodes and connections to other networks, including a voice/data network such as the Public Switched Telephone Network (PSTN), a packet network such as the Internet, a local area network (LAN), a metropolitan area network (MAN), a wide area network (WAN), enterprise networks, private networks, and so forth.

In one embodiment, cellular telephone 102-1 may include a DAC 110. DAC 110 may convert information between a digital domain and an analog domain. For example, an ADC (not shown) may be used to convert analog voice information to digital signals for communication over a digital wireless system. The ADC may be implemented anywhere in system 100, including cellular telephone 102-1. DAC 110 may be used to convert digital signals to analog signals. For example, cellular telephone 102-1 may use DAC 110 to convert digital signals received from based station 102-2 to analog voice information prior to reproducing the voice information for a listener.

When implementing a DAC, there may be a need to use one or more filtering techniques to remove noise from a signal. The noise may originate from a number of sources, such as imperfections in the transmission system, manufacturing defects, signal processing errors, and so forth. The use of conventional filters, however, may be undesirable for a number of reasons. For example, some cellular architectures may use an anti-alias filter. Anti-aliasing filters are typically implemented using high-order analog filter architectures that may require bulky and expensive capacitive and inductive elements. Such bulky capacitors and inductors may also be problematic when attempting to integrate a system on an Integrated Circuit (IC) chip. For example, the required inductor or capacitor specifications may result in sizes that are too large to be integrated on an IC, or may require fabrication material or techniques that are difficult to integrate with the fabrication technology implemented for other parts of the system. Furthermore, conventional architectures typically implement the anti-alias filter after the DAC. The anti-alias filter components may dissipate some of the output power of the DAC thereby decreasing power efficiency of the system. Such a scenario can arise when using, for example, binary (digital) segmented RF signal power amplifiers (PA), where the PA segments are $2^i$ weighted in terms of their equivalent RF amplification gain. In this scenario the PA may operate as both the DAC and the PA. Therefore, it may be undesirable to follow the PA with circuit elements that may waste output power delivered to the transmit antenna.

Some embodiments solve these and other problems. Some embodiments may use a novel technique to implement a filter with a DAC. In one embodiment, for example, the filter may be integrated with DAC 110, although the embodiments are not necessarily limited in this context. DAC 110 may filter individual digital bit streams using an impulse response emulation technique. DAC 110 may complete conversion operations on the filtered bit streams by performing $2^i$ weighted-sum operations on the filtered outputs, for example. DAC 110 may be described in more detail with reference to FIG. 2.

Figure 2:
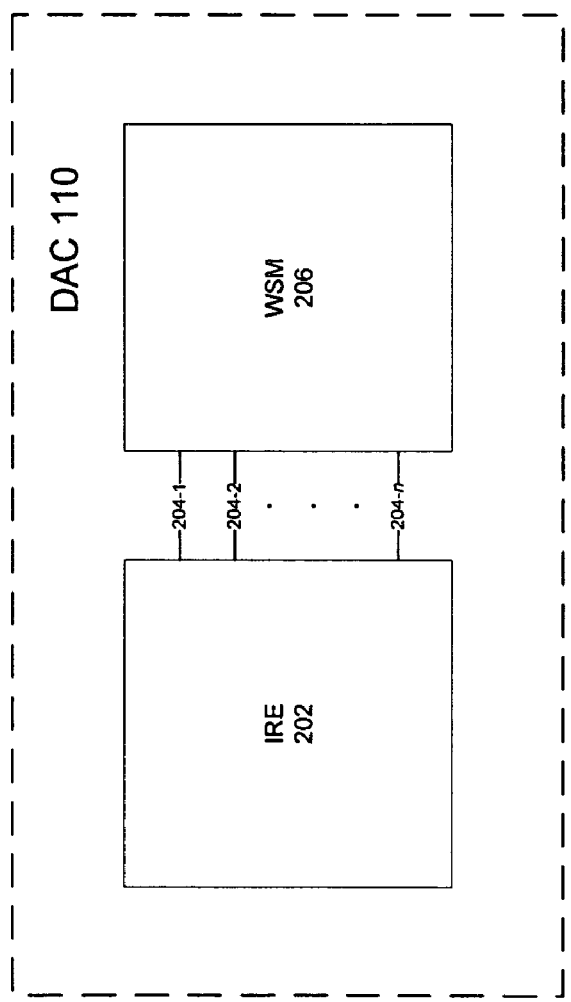
FIG. 2 illustrates an exemplary block diagram of a digital-to-analog converter in accordance with one embodiment.

FIG. 2 illustrates an exemplary block diagram of a DAC in accordance with one embodiment. FIG. 2 illustrates a block diagram of one possible implementation of DAC 110 suitable for use with one or more nodes 102-1-p of system 100, such as node 102-1, for example. The embodiments are not limited, however, to the example given in FIG. 2.

As shown in FIG. 2, DAC 110 may comprise multiple elements, such as elements 202, 204 and 206. These elements may be implemented using one or more circuits, components, registers, processors, software subroutines, modules, or any combination thereof, as desired for a given set of design or performance constraints. Although FIG. 2 shows a limited number of elements by way of example, it can be appreciated that more or less elements may be used in DAC 110 as desired for a given implementation.

In one embodiment, DAC 110 may be arranged to perform DAC operations for a given node or device. Operations to convert or decode a digital signal into its equivalent analog signal typically include at least three stages. The first stage may comprise detecting the presence of the digital pulses. This detection may be performed by examining the digital signal at specific instants of time to determine whether a fixed threshold is exceeded or not. If the digital signal exceeds the threshold at the examining instant, then it is decided that a digital pulse corresponding to a binary 1 may be present, otherwise a 0 may be present. The second stage may comprise decoding the binary data into an analog signal. The analog signal may comprise a series of pulses with amplitudes equal to the decoded binary value and a time width equal to the sampling interval. The third stage may comprise smoothing the analog signal using a filter, such as a low-pass filter or anti-aliasing filter with a given width.

Some embodiments may use a novel technique to integrate a filter with DAC 110. DAC 110 may be arranged to filter individual digital signals using an impulse response emulation technique. In one embodiment, for example, DAC 110 may include an impulse response emulator (IRE). IRE 202 may receive multiple digital signals each having a predetermined or known waveform. In one embodiment, for example, the multiple digital signals may comprise binary digital signals, although the embodiments are not limited in this context. A binary digital signal may comprise a digital signal that represents one of two discrete values, such as a "1" and a "0". The predetermined waveform may comprise any type of waveform that has known characteristics, such as a basic or fundamental shape. One example of a predetermined waveform may comprise a square pulse, although the embodiments are not limited in this context. In one embodiment, for example, the predetermined waveform may comprise a predetermined periodic waveform, although the embodiments are not limited in this context. A periodic waveform may have a basic or fundamental shape that repeats over time. Examples of periodic waveforms may include a square wave, a triangular wave, a sawtooth wave, and so forth. The embodiments are not limited to a particular type of digital signal or predetermined waveform, as long as the characteristics of the digital signal and predetermined waveform are known in advance.

In one embodiment, for example, IRE 202 may receive multiple digital signals each having a square wave periodic waveform. Although one embodiment may use a square waveform by way of example, it may be appreciated that IRE 202 may be modified for use with any type of periodic waveform as desired for a given set of design constraints.

In one embodiment, for example, IRE 202 may convert a sequence of bits from each digital signal to a predetermined analog waveform corresponding to the sequence of bits. The predetermined analog waveform may represent a predetermined impulse response for a filter based on the known input waveform.

In one embodiment, DAC 110 may include a weighted-sum module (WSM) 206. WSM 206 may perform any remaining DAC operations on the resulting individual waveforms or bit streams received from IRE 202 via lines 204-1-n, where n represents a number of bit streams for a given implementation. For example, WSM 206 may perform the appropriate $2^i$ weighted-sum operation on the filtered outputs.

In one embodiment, the impulse response emulation technique implemented using IRE 202 and WSM 206 may exploit the known characteristics of the input bit streams. This phenomenon may be described in more detail with reference to FIG. 3.

Figure 3:
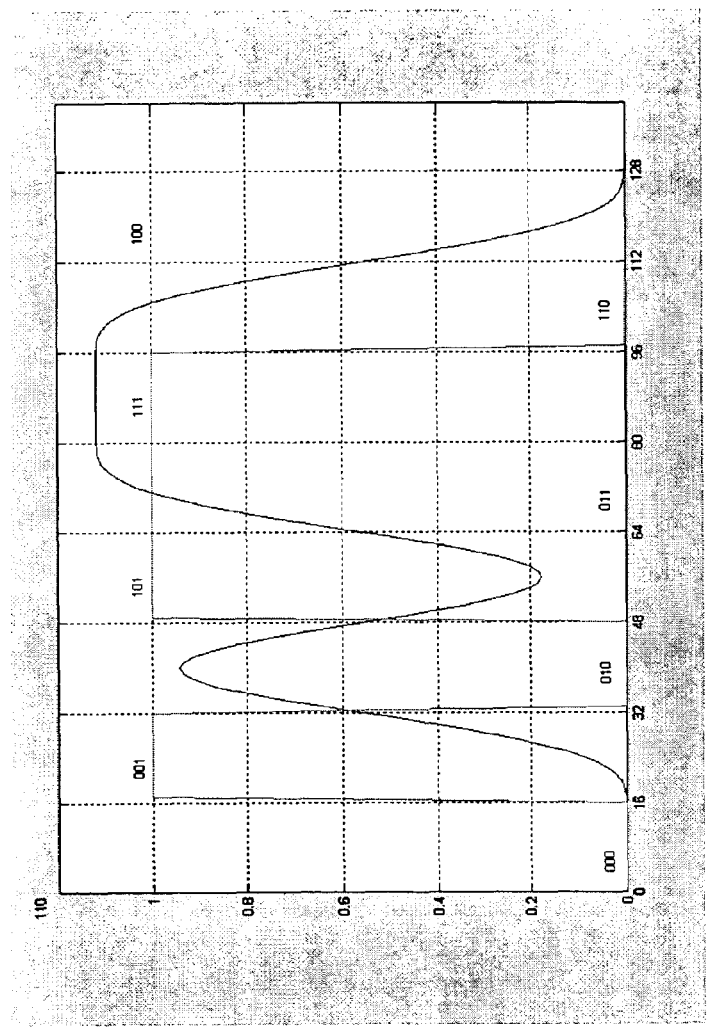
FIG. 3 illustrates a graph of various filter responses in accordance with one embodiment.

FIG. 3 illustrates a graph of various filter responses in accordance with one embodiment. FIG. 3 illustrates a graph 300. Graph 300 may illustrate a set of filter responses to various combinations of input bit sequences. For example, assume IRE 202 receives a periodic signal in the form of a square wave. When a stream of square pulses, each with duration $T_b$, excites a linear filter, the response of the filter during the $k^{th}$ bit duration can be calculated as a function of the impulse response of the filter and the values of the $(k-L)^{th}$ to the $k^{th}$ bits, where L is the duration of the impulse response of the filter expressed in number of $T_b$ intervals. That is, the impulse-response duration of the filter is $LT_b$.

FIG. 3 illustrates an example of a filter response to square-pulse excitations for a filter with an impulse-response duration L=2, thereby resulting in $2^{(L+1)}$ waveforms. The bit-excitation or bit-history that resulted in the corresponding $T_b$-long waveform is also shown. The square graph shows the sequence of input bits versus time. The curved graph shows the corresponding filter response to the input bits versus time. The eight different bit annotations "000", "001", . . . , "111" explicitly indicate the combination of the current bit and last two bits that result in the corresponding filter response.

Based on the information provided by graph 300, it may be possible to mimic or emulate a response for a filter to a given stream of square-pulses. This may be accomplished by monitoring the last L+1 bits, and generating a corresponding analog waveform that emulates the response based on predetermined knowledge of the impulse response of the filter. The impulse response for a filter to a given stream of square pulses may be derived using the convolution of the impulse response of the filter with the input sequence of square pulses. An example of the possible range of predetermined impulse responses for a given filter size may be described in more detail with reference to FIGS. 4A–D.

Figure 4A:
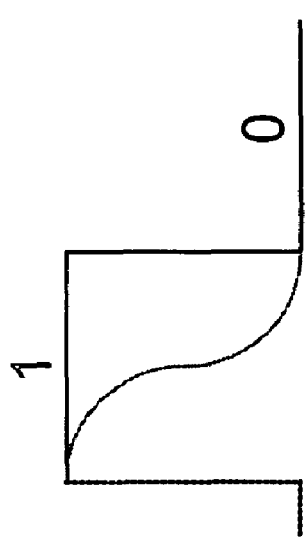
FIGS. 4A–D illustrates four graphs of various filter responses in accordance with one embodiment.
Figure 4C:
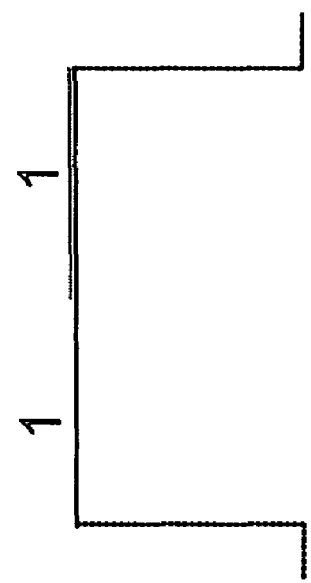
Figure 4B:
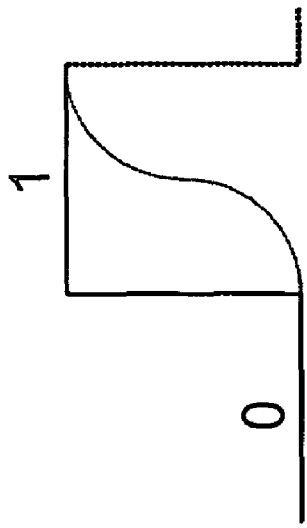
Figure 4D:

FIGS. 4A–D illustrates four graphs of various filter responses in accordance with one embodiment. Consider a case where L=1 and filter memory is equal to 2, thereby indicating that the impulse response for a filter uses only the current bit and preceding bit. Four possible responses of the filter to the bit sequence may be determined in this example (e.g., $2^{(L+1)}=2^{(1+1)}=4$). FIGS. 4A–D may illustrate each of the four possible filter output transitions. FIG. 4A illustrates the case where a binary digital signal transitions from a current bit value of 0 to a next bit value of 1. FIG. 4B illustrates the case where a binary digital signal transitions from a current bit value of 0 to a next bit value of 0. FIG. 4C illustrates the case where a binary digital signal transitions from a current bit value of 1 to a next bit value of 0. FIG. 4D illustrates the case where a binary digital signal transitions from a current bit value of 1 to a next bit value of 1.

Some embodiments may exploit the known characteristics of a digital signal to determine in advance the filter responses to a sequence of bits within the signal. As shown in FIGS. 4A–D, for the case where L=1 there are only four possible impulse responses to output from the filter. IRE 202 and WSM 206 may be arranged to generate and/or store all the possible impulse responses for a given filter configuration, and select the appropriate predetermined filter response to produce a filtered waveform corresponding to a given sequence of bits represented by the digital signal. Example implementations for IRE 202 and WSM 206 of DAC 110 may be described in more detail with reference to FIGS. 5–8.

Figure 5:
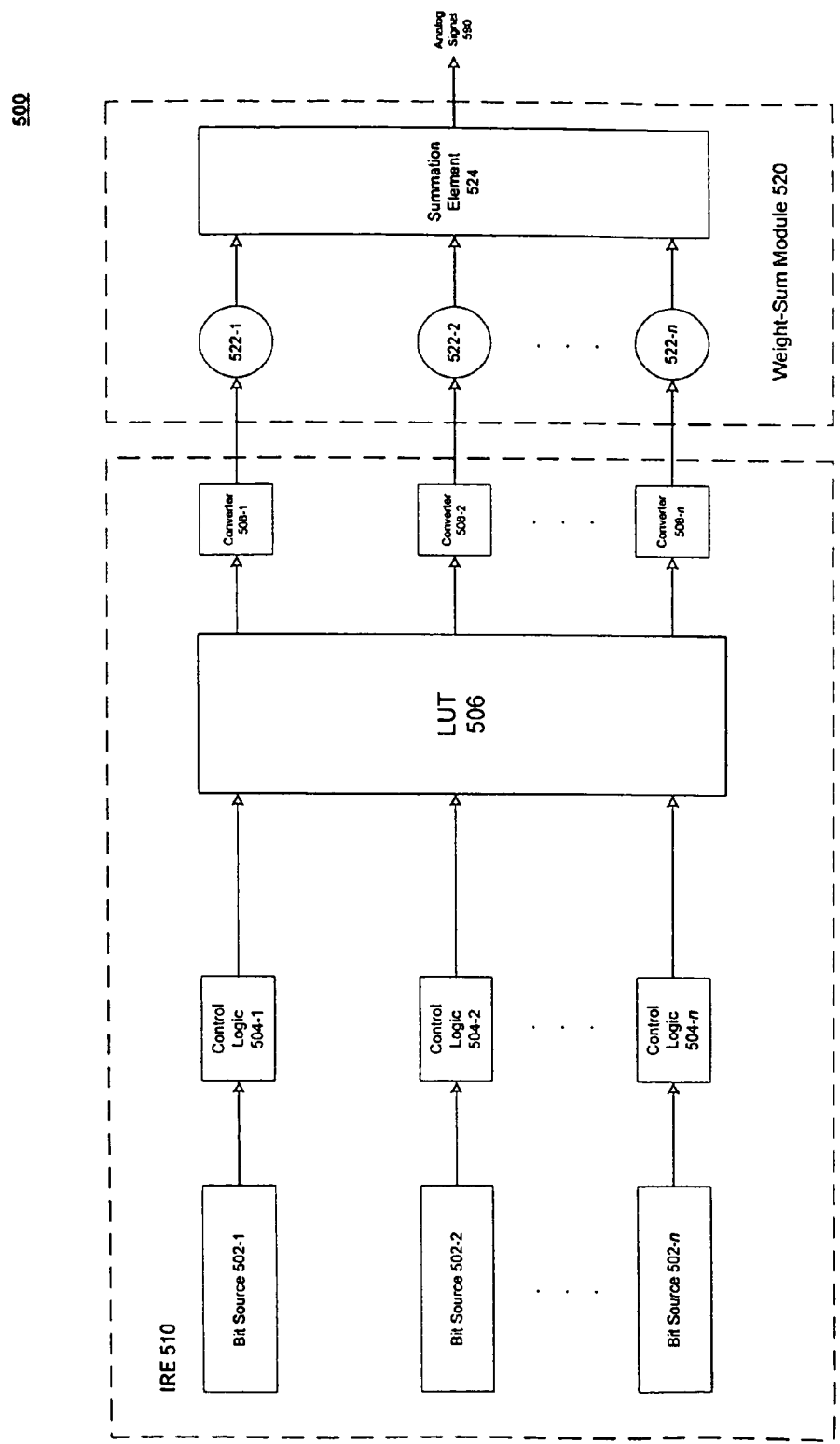
FIG. 5 illustrates an exemplary block diagram for a first implementation of a digital-to-analog converter in accordance with one embodiment.

FIG. 5 illustrates an exemplary block diagram for a first implementation of a DAC in accordance with one embodiment. FIG. 5 illustrates a block diagram of a DAC 500. DAC 500 may comprise a more detailed implementation of DAC 110, for example, as described with reference to FIG. 2. The embodiments are not limited, however, to the example implementation described with reference to DAC 500.

As shown in FIG. 5, DAC 500 may comprise multiple elements, such as elements 510 and 520. These elements, or the sub-elements included therein, may be implemented as one or more circuits, components, registers, processors, software subroutines, modules, or any combination thereof, as desired for a given set of design or performance constraints. Although FIG. 5 shows a limited number of elements by way of example, it can be appreciated that more or less elements may be used in DAC 500 as desired for a given implementation.

In one embodiment, DAC 500 may include an IRE 510. IRE 510 may comprise a more detailed implementation of IRE 202, for example, as described with reference to FIG. 2. The embodiments are not limited, however, to the example implementation described with reference to IRE 510.

In one embodiment, IRE 510 may include a bit path for each received digital signal, with each bit path to include a control logic and a converter. For example, a first bit path may comprise bit source 502-1, control logic 504-1 and converter 508-1. In another example, a second bit path may comprise bit source 502-2, control logic 504-2 and converter 508-2. In yet another example, a $n^{th}$ bit path may comprise bit source 502-n, control logic 504-n and converter 508-n, with n representing a number of digital signals implemented for a given set of design constraints. For example, if DAC 500 is arranged to process 1 bit/second, and the sampling rate is 5 times the bit rate, then IRE 510 may receive 5 samples/second (n=5).

In one embodiment, bit source 502-1-n may represent a source of bits from a given digital signal. In one embodiment, for example, bit source 502-1-n may perform the first stage of converting or decoding a digital signal into its equivalent analog signal by detecting the presence of the digital pulses. Bit source 502-1-n may examine the received digital signal at specific instants of time to determine whether a fixed threshold is exceeded or not. If the digital signal exceeds the threshold at the examining instant, then bit source 502-1-n may determine that a digital pulse corresponding to a binary 1 may be present. If the digital signal fails to exceed the threshold at the examining instant, then bit source 502-1-n may determine that a digital pulse corresponding to a binary 0 may be present. It may be appreciated that the logic may be reversed and still fall within the scope of the embodiments. It may also be appreciated that the bit detection may be performed prior to reaching DAC 500, and therefore bit source 502-1-n may be omitted. Bit source 502-1-n may output the binary values to a corresponding control logic 504-1-n.

In one embodiment, control logic 504-1-n may receive a sequence of bits from a corresponding digital signal, and output a control word using the sequence of bits. In one embodiment, for example, the control word may comprise an address for a lookup table (LUT) 506. It is worthy to note that although FIG. 5 illustrates only a single representative control line between each of control logic 504-1-n and LUT 506, it may be appreciated that multiple control lines may be used to communicate the control word between control logic 504-1-n and LUT 506. In one embodiment, for example, m control lines may be used between each control logic 504-1-n and LUT 506, where m=L+1 and L is the impulse response duration for a filter in number of bits. Each control line may be used to convey a corresponding bit of the control word.

In one embodiment, each control logic 504-1-n may be coupled to LUT 506. LUT 506 may comprise any type of memory circuit, device or unit arranged to store data. In one embodiment, for example, LUT 506 may be implemented using any type of non-volatile memory, such as a read-only memory (ROM) memory circuit. LUT 506 may comprise various storage locations within the memory device. The storage locations may be addressed by driving the input or address lines of the memory device with the proper binary values. LUT 506 may store a set of defined outputs for every set of input values. LUT 506 may output the defined output values for any given combination of input states. In this manner, LUT 506 may be used to generate the characteristic response of a particular logic function, such as a filter, for example.

In one embodiment, for example, LUT 506 may receive as input a control word from control logic 504-1-n. The individual values of the control word may drive the address lines of LUT 506 to cause LUT 506 to output digital information representative of a predetermined analog waveform corresponding to the control word. The digital information may comprise, for example, a parallel stream of filtered digital bits representative of the sample of interest. Each predetermined analog waveform may correspond to a predetermined impulse response for a filter corresponding to a given filter size as represented by the code word generated by a given control logic 504-1-n. LUT 506 may use the control word to output a set of digital values representing the selected predetermined analog waveform to a corresponding converter 508-1-n. It is worthy to note that although a single larger LUT 506 is shown in DAC 500 by way of example, it may be appreciated that multiple smaller LUTs may be used and still fall within the scope of the embodiments.

In one embodiment, a converter 508-1-n for each bit path may be coupled to LUT 506. Each converter 508-1-n may receive the digital information from LUT 506 corresponding to a given bit path. Each converter 508-1-n may convert the digital information representing a given predetermined analog waveform into the actual predetermined analog waveform.

In one embodiment, DAC 500 may include a WSM 520. WSM 520 may comprise a more detailed implementation of WSM 206, for example, as described with reference to FIG. 2. The embodiments are not limited, however, to the example implementation described with reference to WSM 520.

In one embodiment, WSM 520 may complete conversion operations on the filtered bit streams using the appropriate DAC technique, such as by performing $2^i$ weighted-sum operations on the filtered outputs, where i equals $0, \ldots, n-1$, for example. In one embodiment, for example, WSM 520 may comprise a weighting element 522-1-n for each bit path and a summation element 524. Each weighting element 522-1-n may weight the received analog waveform and output a weighted analog waveform. Summation element 524 may receive the weighted analog waveforms from each weighting element 522-1-n and sum the weighted analog waveforms to form an analog output signal 590.

Figure 6:
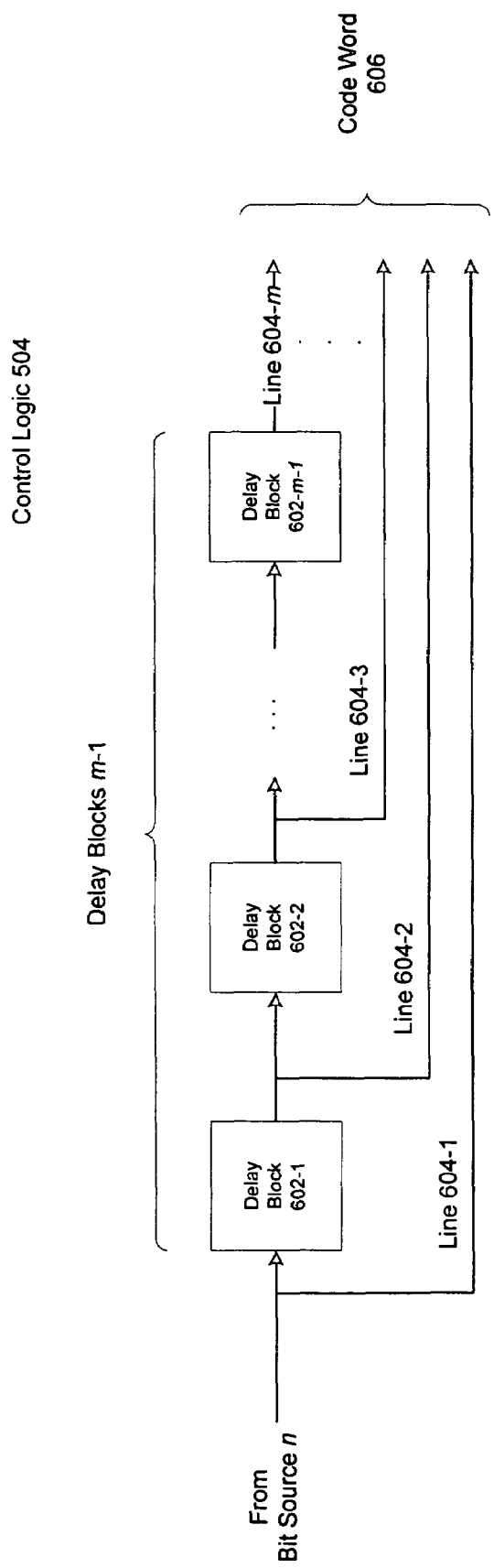
FIG. 6 illustrates an exemplary block diagram of a control logic for the first digital-to-analog converter in accordance with one embodiment.

FIG. 6 illustrates an exemplary block diagram of a control logic for the first DAC in accordance with one embodiment. FIG. 6 illustrates a block diagram of a control logic 504 for DAC 500. Control logic 504 may be representative of any of control logics 504-1-n as described with reference to FIG. 5. The embodiments are not limited, however, to the example described with reference to control logic 504.

In one embodiment, control logic 504 may receive a sequence of bits from a corresponding digital signal, and output a control word using the sequence of bits. For example, control logic 504 may receive a sequence of binary values from a corresponding bit source 502. Control logic 504 may have sufficient memory resources to store a certain number of bits based on a determined filter size for a given implementation. The memory resources may comprise any suitable type of memory resources, such as a buffer, shift register, and so forth. In one embodiment, for example, the memory resource may comprise an m-bit shift register.

In one embodiment, control logic 504 may output a control word 606 corresponding to the bits stored in the memory resource. This may be accomplished by delaying output of a certain number of bits by a certain time period so that control word 606 is received by LUT 506 at the same time interval (e.g., clock cycle). In one embodiment, for example, control logic 504 may store binary values using delay blocks m−1 as the binary values are received from a bit source n. The number of delay blocks may vary in accordance with the duration of the impulse response of the filter expressed in number of $T_b$ intervals (e.g., L). For example, if L=2 then control logic 504 may need a total of 2 delay blocks 602-1 and 602-2 (e.g., m−1=(L+1)−1=(2+1)−1=2). Each of delay blocks 602-1 and 602-2 may be used to delay two previously received binary values, and output the two previous binary values over control lines 604-2 and 604-3, respectively. A current binary value may be communicated over control line 604-1. As a result, control logic 504 may output control word 606 via control lines 604-1-3, with control word 606 comprising a current binary value and the preceding two binary values at any given time interval. Control word 606 may be passed over m control lines, with each control line to convey a corresponding binary value of control word 606.

Figure 7:
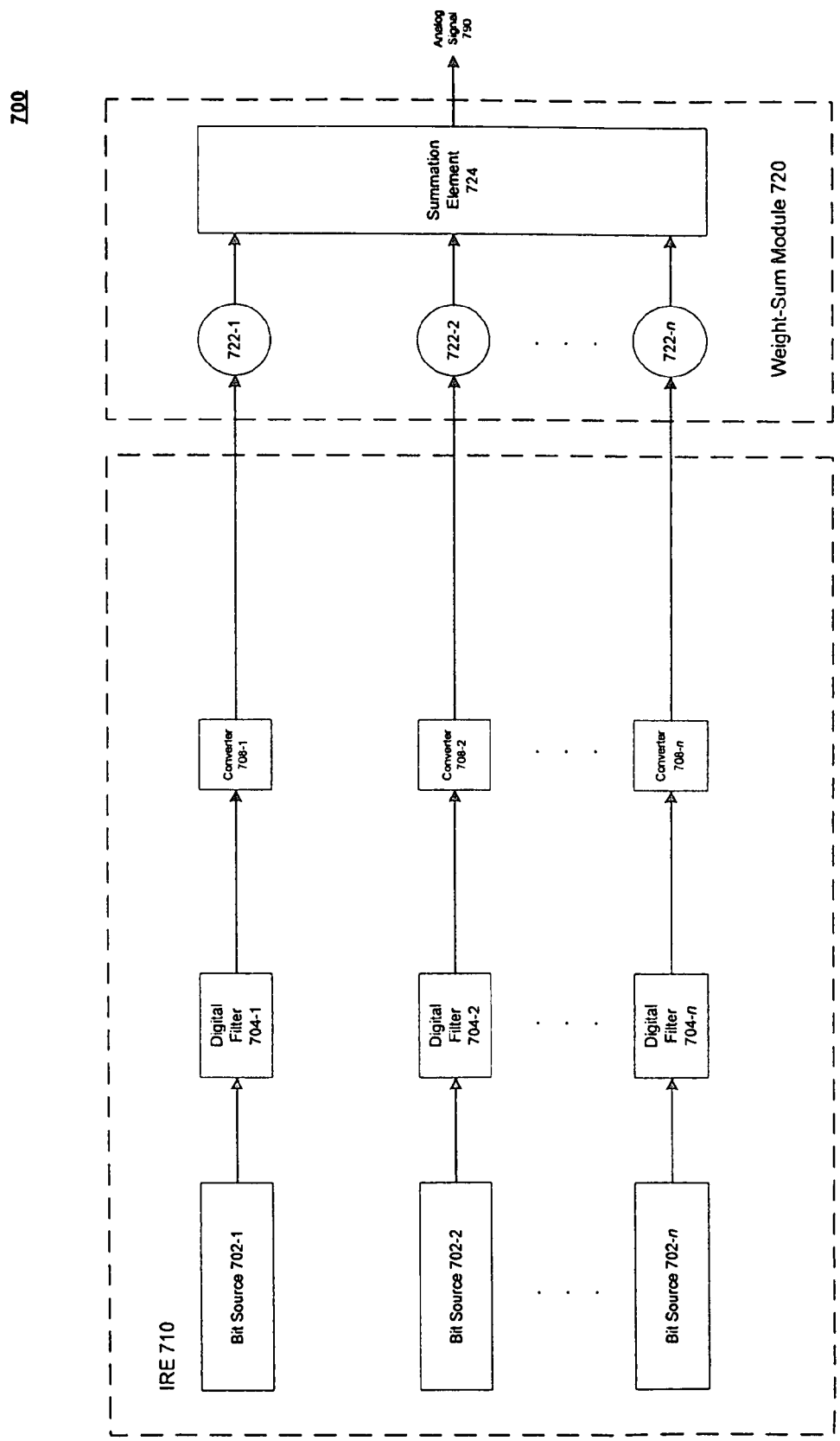
FIG. 7 illustrates an exemplary block diagram for a second implementation of a digital-to-analog converter in accordance with one embodiment.

FIG. 7 illustrates an exemplary block diagram for a second implementation of a DAC in accordance with one embodiment. FIG. 7 illustrates a block diagram of a DAC 700. DAC 700 may comprise a more detailed implementation of DAC 110, for example, as described with reference to FIG. 2. The embodiments are not limited, however, to the example implementation described with reference to DAC 700.

As shown in FIG. 7, DAC 700 may comprise multiple elements, such as elements 710 and 720. These elements, or the sub-elements included therein, may be implemented as one or more circuits, components, registers, processors, software subroutines, modules, or any combination thereof, as desired for a given set of design or performance constraints. Although FIG. 7 shows a limited number of elements by way of example, it can be appreciated that more or less elements may be used in DAC 700 as desired for a given implementation.

In one embodiment, DAC 700 may be similar in structure and operation to DAC 500. For example, WSM 720 may be similar to WSM 520. IRE 710, however, may be modified with respect to IRE 510 as described with reference to FIG. 5.

In one embodiment, for example, control logic 504-1-n and LUT 506 of IRE 510 may be replaced with one or more digital filters 704-1-n. In signal processing, the function of a filter is to remove unwanted parts of the signal, such as random noise, or to extract useful parts of the signal, such as the components lying within a certain frequency range. A digital filter may use a digital processor to perform numerical calculations on sampled values of the signal. The processor may be any type of processor as described in more detail below. In one embodiment, for example, the processor may comprise a Digital Signal Processor (DSP).

In one embodiment, each digital filter 704-1-n may receive digital signals from a corresponding bit source 702-1-n. For example, the digital signals may comprise binary numbers, representing successive sampled values of the input signal. The binary values are transferred to the processor, which carries out numerical calculations on them. These calculations typically involve multiplying the input values by constants and adding the products together. The results of these calculations, which now represent sampled values of the filtered signal, may be output to converters 708-1-n for converting the signal back to analog form.

In one embodiment, each bit path includes a digital filter 704-1-n. Each digital filter 704-1-n may be arranged to receive a sequence of bits from a corresponding digital signal and output digital information representing a given predetermined analog waveform. Since the input waveform is known, and the impulse response of the filter is known, digital filters 704-1-n may be programmed to calculate the appropriate output digital values representing the predetermined analog waveform desired for a given set of input digital values. Similar to converters 508-1-n as described with reference to FIG. 5, converters 708-1-n may receive the corresponding filtered digital values, and convert the filtered digital values representing a given predetermined analog waveform into the actual predetermined analog waveform. Similar to WSM 520 as described with reference to FIG. 5, WSM 720 may complete conversion operations on the filtered bit streams using the appropriate DAC technique, such as by performing $2^i$ weighted-sum operations on the filtered outputs, where i equals 0, . . . , n−1, for example.

Operations for the above embodiments may be further described with reference to the following figures and accompanying examples. Some of the figures may include a logic flow. Although such figures presented herein may include a particular logic flow, it can be appreciated that the logic flow merely provides an example of how the general functionality as described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited in this context.

Figure 8:
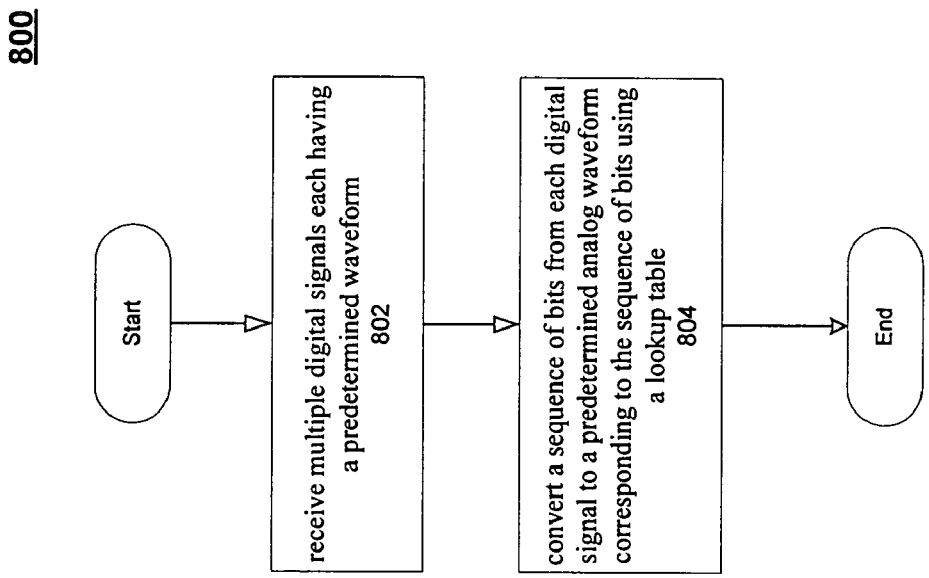
FIG. 8 illustrates an exemplary block flow diagram for a first logic flow in accordance with one embodiment.

FIG. 8 illustrates an exemplary block flow diagram for a first logic flow in accordance with one embodiment. FIG. 8 illustrates a logic flow 800. Logic flow 800 may be representative of the operations executed by one or more embodiments. As shown in logic flow 800, multiple digital signals each having a predetermined waveform may be received at block 802. A sequence of bits from each digital signal may be converted to a predetermined analog waveform corresponding to the sequence of bits using a LUT at block 804. The embodiments are not limited in this context.

In one embodiment, for example, the predetermined analog waveform may represent a predetermined impulse response for a filter based on the periodic waveform. The embodiments are not limited in this context.

In one embodiment, for example, a control word may be generated using a sequence of bits from the digital signal. The control word may comprise, for example, an address for the LUT. The address may be used to retrieve digital information representing the predetermined analog waveform. The embodiments are not limited in this context.

In one embodiment, the digital information may be converted into the predetermined analog waveform. The predetermined analog waveform may be weighted. The weighted analog waveform may be summed with other weighted analog waveforms to form an analog output signal. The embodiments are not limited in this context.

Figure 9:
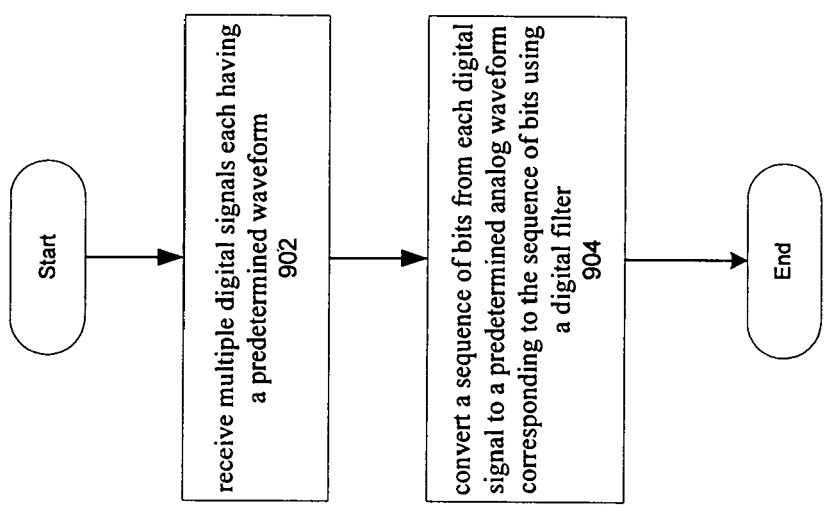
FIG. 9 illustrates an exemplary block flow diagram for a second logic flow in accordance with one embodiment.

FIG. 9 illustrates an exemplary block flow diagram for a second logic flow in accordance with one embodiment. FIG. 9 illustrates a logic flow 900. Logic flow 900 may be representative of the operations executed by one or more embodiments. As shown in logic flow 900, multiple digital signals each having a predetermined waveform may be received at block 902. A sequence of bits from each digital signal may be converted to a predetermined analog waveform corresponding to the sequence of bits using at least one digital filter at block 904. The embodiments are not limited in this context.

In one embodiment, for example, the predetermined analog waveform may represent a predetermined impulse response for a filter based on the periodic waveform. The embodiments are not limited in this context.

In one embodiment, for example, a sequence of bits may be received from a corresponding digital signal. Digital information representing the predetermined analog waveform may be generated by the digital filter.

In one embodiment, the digital information may be converted into the predetermined analog waveform. The predetermined analog waveform may be weighted. The weighted analog waveform may be summed with other weighted analog waveforms to form an analog output signal. The embodiments are not limited in this context.

Some embodiments may implement DAC 110 using hardware, software, or a combination of both. When implemented in software, for example, DAC 110 may be implemented using a processing system comprising a processor and memory. The processor may be implemented as any processor, such as a complex instruction set computer (CISC) microprocessor, a reduced instruction set computing (RISC) microprocessor, a very long instruction word (VLIW) microprocessor, a processor implementing a combination of instruction sets, a general-purpose processor, or other processor device. The processor may also be implemented as a dedicated processor, such as a controller, microcontroller, embedded processor, a digital signal processor (DSP), a network processor, a media processor, an input/output (I/O) processor, and so forth. The memory may include any machine-readable or computer-readable media capable of storing data, including both volatile and non-volatile memory. For example, the memory may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
a digital-to-analog converter having an impulse response emulator, said impulse response emulator to receive multiple digital signals each having a predetermined waveform, and convert a sequence of bits from each digital signal to a predetermined analog waveform corresponding to said sequence of bits using a lookup table.

2. The apparatus of claim 1, said predetermined analog waveform to represent a predetermined impulse response for a filter based on said predetermined waveform.

3. The apparatus of claim 1, said impulse response emulator to include a bit path for each digital signal, with each bit path to include a control logic coupled to said lookup table, said control logic to receive a sequence of bits from a corresponding digital signal and output a control word using said sequence of bits, said control word to comprise an address for said lookup table.

4. The apparatus of claim 3, said lookup table to receive said address and output digital information representing said predetermined analog waveform corresponding to said address.

5. The apparatus of claim 4, comprising a converter for each bit path coupled to said lookup table, said converter to receive said digital information and convert said digital information into said predetermined analog waveform.

6. The apparatus of claim 1, comprising a weighted-sum module coupled to said converters, said weighted-sum module having a weighting element for each bit path and a summation element, said weighting element to weight said predetermined analog waveform and output a weighted analog waveform, and said summation element to sum said weighted analog waveform with other weighted analog waveforms to form an analog output signal.

7. An apparatus, comprising:
a digital-to-analog converter having an impulse response emulator, said impulse response emulator to receive multiple digital signals each having a predetermined waveform, and convert a sequence of bits from each digital signal to a predetermined analog waveform corresponding to said sequence of bits using at least one digital filter.

8. The apparatus of claim 7, said predetermined analog waveform to represent a predetermined impulse response for a filter based on said predetermined waveform.

9. The apparatus of claim 7, said impulse response emulator to include a bit path for each digital signal, with each bit path to include a digital filter, said digital filter to receive a sequence of bits from a corresponding digital signal and output digital information representing said predetermined analog waveform.

10. The apparatus of claim 9, comprising a converter coupled to each digital filter, said converter to receive said digital information and convert said digital information into said predetermined analog waveform.

11. The apparatus of claim 7, comprising a weighted-sum module coupled to said converters, said weighted-sum module having a weighting element for each bit path and a summation element, said weighting element to weight said predetermined analog waveform and output a weighted analog waveform, and said summation element to sum said weighted analog waveform with other weighted analog waveforms to form an analog output signal.

12. A method, comprising:
receiving multiple digital signals each having a predetermined waveform; and converting a sequence of bits from each digital signal to a predetermined analog waveform corresponding to said sequence of bits using a lookup table;
said predetermined analog waveform to represent a predetermined impulse response for a filter based on said predetermined waveform.

13. The method of claim 12 comprising generating a control word using a sequence of bits from said digital signal, said control word to comprise an address for said lookup table.

14. The method of claim 13, comprising retrieving digital information representing said predetermined analog waveform using said address.

15. The method of claim 14, comprising converting said digital information into said predetermined analog waveform.

16. The method of claim 12 comprising:
weighting said predetermined analog waveform; and
summing said weighted analog waveform with other weighted analog waveforms to form an analog output signal.

17. A method, comprising:
receiving multiple digital signals each having a predetermined waveform; and
converting a sequence of bits from each digital signal to a predetermined analog waveform corresponding to said sequence of bits using a digital filter;
said predetermined analog waveform to represent a predetermined impulse response for a filter based on said predetermined waveform.

18. The method of claim 17, comprising:
receiving a sequence of bits from a corresponding digital signal; and
generating digital information representing said predetermined analog waveform.

19. The method of claim 18, comprising converting said digital information into said predetermined analog waveform.

20. The method of claim 17 comprising:
weighting said predetermined analog waveform; and
summing said weighted analog waveform with other weighted analog waveforms to form an analog output signal.

* * * * *